United States Patent
Reinmuth et al.

(10) Patent No.: US 9,567,205 B2
(45) Date of Patent: Feb. 14, 2017

(54) MICROMECHANICAL SENSOR DEVICE WITH A GETTER IN AN ENCLOSED CAVITY

(71) Applicant: Robert Bosch GmbH, Stuttgart (DE)

(72) Inventors: Jochen Reinmuth, Reutlingen (DE); Julian Gonska, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/534,903

(22) Filed: Nov. 6, 2014

(65) Prior Publication Data

US 2015/0123221 A1  May 7, 2015

(30) Foreign Application Priority Data

Nov. 7, 2013  (DE) .......... 10 2013 222 583

(51) Int. Cl.
*B81B 7/00* (2006.01)
*B81C 1/00* (2006.01)
*B81B 3/00* (2006.01)

(52) U.S. Cl.
CPC .......... *B81B 7/0038* (2013.01); *B81B 3/0051* (2013.01); *B81C 1/00238* (2013.01); *B81C 1/00285* (2013.01); *B81C 2203/0792* (2013.01); *H01L 2924/16235* (2013.01)

(58) Field of Classification Search
CPC ............................ B81B 7/0038; B81C 1/00285
USPC ...................................................... 257/417
See application file for complete search history.

(56) References Cited

U.S. PATENT DOCUMENTS

| | | | |
|---|---|---|---|
| 2002/0037633 A1* | 3/2002 | Satou et al. | 438/476 |
| 2013/0001710 A1 | 1/2013 | Daneman et al. | |
| 2013/0147051 A1* | 6/2013 | Shroff | H01L 23/522 257/774 |
| 2013/0214400 A1* | 8/2013 | Shu | B81B 7/0038 257/682 |
| 2014/0022718 A1* | 1/2014 | Yamazaki | G01J 5/029 361/679.01 |

FOREIGN PATENT DOCUMENTS

DE  19537814  4/1997
WO  WO2007/113325  10/2007

* cited by examiner

*Primary Examiner* — Peter Bradford
(74) *Attorney, Agent, or Firm* — Norton Rose Fulbright US LLP; Gerard Messina

(57) ABSTRACT

A micromechanical sensor device and a corresponding manufacturing method are described. The micromechanical sensor device includes a CMOS wafer having a front side and a rear side, a rewiring device formed on the front side of the CMOS wafer including a plurality of stacked printed conductor levels and insulation layers, an MEMS wafer having a front side and a rear side, a micromechanical sensor device formed across the front side of the MEMS wafer, a bond connection between the MEMS wafer and the CMOS wafer, a cavern between the MEMS wafer and the CMOS wafer, in which the sensor device is hermetically enclosed, and an exposed getter layer area applied to at least one of the plurality of stacked printed conductor levels and insulation layers.

4 Claims, 6 Drawing Sheets

MICROMECHANICAL SENSOR DEVICE WITH A GETTER IN AN ENCLOSED CAVITY

FIELD OF THE INVENTION

The present invention relates to a micromechanical sensor device and a corresponding manufacturing method.

BACKGROUND INFORMATION

Although any micromechanical elements are applicable, the present invention and the problems underlying it are elucidated by referring to elements based on silicon.

Manufacturing methods for micromechanical sensor devices, for example, for micromechanical rotation rate sensors and acceleration sensors, are well-known in the related art.

As described, for example, in German Published Patent Application No. 195 37 814, a plurality of free-standing, thick polycrystalline functional structures are produced on a substrate. Buried printed conductors and electrodes are situated under these functional structures. The micromechanical functional structures manufactured in this way are sealed in the further process sequence using a cap wafer. Depending on the application, a suitable pressure is enclosed within the volume sealed by the cap wafer.

In the case of rotation rate sensors, a very low pressure is enclosed, typically 1 mbar. The background is that in the case of rotation rate sensors, a part of the movable structure is driven resonantly and the deflection resulting from the Coriolis force is measured. In the case of low pressure, it is possible to excite an oscillation very simply using relatively low voltages due to the low attenuation. The same applies also to magnetic field sensors which oscillate resonantly in an external magnetic field via a current, it being possible to determine the magnetic field via the deflection of the resonant oscillations.

In the case of acceleration sensors, it is, however, not desirable for the sensor to begin to oscillate, which would be possible if an external acceleration were applied. For that reason, these acceleration sensors are operated at high internal pressures, typically at 500 mbar. In addition, the surfaces of such acceleration sensors are also often provided with organic coatings, which prevent an adhesive bonding of the movable structures.

FIG. 4 shows a schematic cross-sectional view for elucidating an exemplary micromechanical sensor device and a corresponding manufacturing method for illustrating the problems underlying the present invention.

In FIG. 4, reference symbol M denotes an MEMS substrate, on which are deposited insulation layers 4a, 4b, for example, oxide layers, as well as a printed conductor layer 3 lying between them. Across layers 3, 4a, 4b is situated a micromechanical functional layer 5 made of polysilicon, which is partially anchored on insulation layer 4b and partially anchored on printed conductor layer 3 and as a result is electrically connected to the latter. An acceleration sensor device S1 and a rotation rate sensor device S2 are structured in micromechanical functional layer 5. Sensor devices S1, S2 are capped in separate hermetically isolated caverns KV1, KV2 by a cap wafer K via a bond connection B.

An exemplary electrical contacting of acceleration sensor device S1 is shown, which extends from micromechanical functional layer 5 via printed conductor layer 3 from acceleration sensor device S1 to a contact KO situated outside of cap wafer K.

Such combinations of an acceleration sensor device S1 and a rotation rate sensor device S2 may be designed to be very small and manufactured cost-effectively.

The different pressure which is needed in cavern KV1 of acceleration sensor device S1 and cavern KV2 of rotation rate sensor device S2 may be achieved by using a getter layer G in cavern KV2 of rotation rate sensor device S2.

When cap wafer K is bonded to micromechanical functional layer 5 with the aid of bond connection B, a high pressure is initially enclosed in both caverns KV1, KV2, which is suitable for acceleration sensor device S1. Subsequently, the getter of getter layer G is activated via a temperature step. The getter pumps (getters) the volume of cavern KV2 of rotation rate sensor device S2 to a low pressure. In order to enclose a defined pressure in it, a mixed gas including an inert gas and a gas which is readily gettered, for example, N2, is used. N2 is gettered and a non-gettering inert gas of the mixed gas, for example, Ne or Ar, then defines the internal pressure in cavern KV2 of rotation rate sensor device S2. The internal pressure defined by the N2/Ne or N2/Ar gas mixture remains in cavern KV1 of acceleration sensor device S1.

Such a use of a getter layer, which is applied in the interior of a cavern of a cap wafer, which caps a micromechanical sensor device, is known from International Published Patent Application No. 2007/113325.

United States Published Patent Application No. 2013/0001710 describes a method and a system for forming an MEMS sensor device, a CMOS wafer being bonded to an MEMS wafer including a micromechanical sensor device. For example, an evaluation circuit for the micromechanical sensor device may be integrated into the CMOS wafer, the evaluation circuit being electrically contactable via the bond connection. In this example, the CMOS wafer assumes the function of the cap wafer.

Should combinations of acceleration sensor devices and rotation rate sensor devices or magnetic field sensor devices also be manufactured in such a system, it would be necessary to provide a getter layer on the CMOS wafer similar to the example according to FIG. 4.

Such a system having a getter layer on a CMOS wafer is, however, critical from two points of view.

Getter layers are normally sputtered on using a shadow mask. This method is very imprecise and, in order to sputter onto a small surface in a defined manner, very large local restrictions must be provided, with the result that the size of such sensor devices is increased unnecessarily.

The activated getter layer is moreover very reactive. If the movable micromechanical functional layer thus comes into contact with the sensor device in the case of a deflection, the micromechanical functional layer remains bonded to it. In other words, it may occur that the micromechanical sensor devices no longer function after a mechanical shock.

SUMMARY OF THE INVENTION

The present invention provides a micromechanical sensor device and a corresponding manufacturing method.

The idea underlying the present invention is that a getter layer is applied to a CMOS system including a CMOS wafer and a rewiring device situated on it with the aid of a lift-off method in a vertically integrated micromechanical sensor device.

It is in particular the idea to provide recesses on the CMOS system, in which the getter layer is accommodated. The getter surfaces lying in such recesses are situated in relation to the movable MEMS structure in such a way that they are unable to contact the getter surfaces in the case of a mechanical overload. The recess in the CMOS system is produced by an isotropic etching method in the uppermost layer or layers of a printed conductor system. The photoresist for this step may also be used simultaneously for the lift-off method. The isotropic undercutting produces a particularly robust variant of the lift-off method. At the same time, a self-adjustment is achieved between the cavern and the getter layer itself. It is thus possible to produce very small, precisely defined getter surfaces sunk in a recess.

The manufacturing method according to the present invention or the corresponding micromechanical sensor device makes it possible to manufacture, for example, an integrated rotation rate and acceleration sensor device including a getter layer, in a compact, cost-effective manner and without adhesive risk after mechanical shocks.

According to a preferred refinement, an uppermost layer of the rewiring device is an uppermost printed conductor level, the getter layer area being embedded in the uppermost printed conductor level in such a way that it is applied to an insulation layer situated under the uppermost printed conductor level. Such a system may be manufactured in a simple etching process.

According to another preferred refinement, an uppermost layer of the rewiring device is an uppermost printed conductor level, the getter layer area being embedded in the uppermost printed conductor level and an insulation layer situated under the uppermost printed conductor level in such a way that it is applied to a second uppermost printed conductor level situated under the insulation layer. This makes it possible to manufacture a thicker getter layer area, which also may be connected electrically via the second uppermost printed conductor layer.

According to another preferred refinement, the getter layer area is connected electrically to a CMOS circuit of the CMOS wafer via one or multiple vias in the rewiring device. Thus the getter layer area may assume an electrical function, for example, an electrode function.

According to another preferred refinement, the getter layer area has a lower height than an uppermost layer of the rewiring device. This makes it possible to avoid adhesive bonding of the getter layer area to the sensor device.

DETAILED DESCRIPTION

Figure 1A:
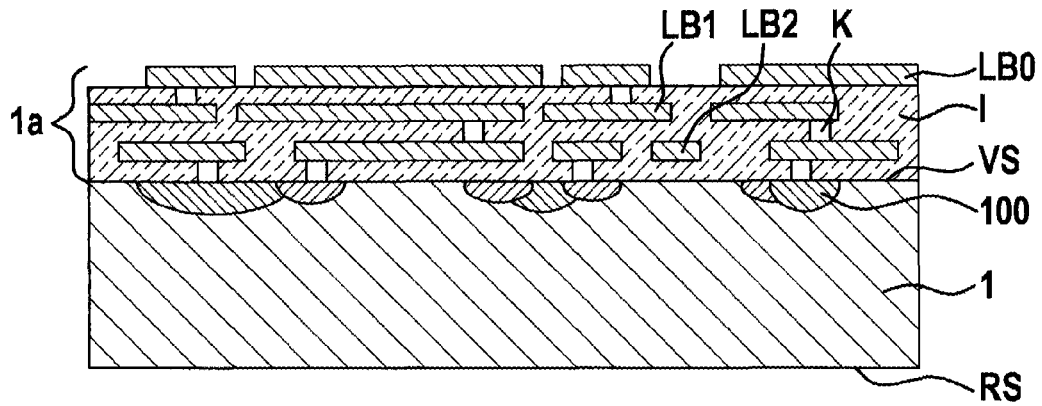
FIGS. 1a through f show schematic cross-sectional views for elucidating a micromechanical sensor device and a corresponding manufacturing method according to a first specific embodiment of the present invention.

Identical reference numerals in the figures denote identical elements or elements having an identical function.

FIGS. 1a through f are schematic cross-sectional views for elucidating a micromechanical sensor device and a corresponding manufacturing method according to a first specific embodiment of the present invention.

In FIG. 1a, reference numeral 1 denotes a CMOS wafer having a front side VS and a rear side RS, which has a plurality of CMOS circuits 100 integrated into it, under which, for example, an evaluation circuit for a micromechanical sensor device is present.

Reference numeral 1a denotes a rewiring device applied to front side VS, the rewiring device including a plurality of stacked insulation layers and printed conductor layers LB0, LB1, LB2. Printed conductor layers LB0, LB1, LB2 are electrically connected to one another and to CMOS circuits 100 via vias K. For the sake of clarity of the presentation, insulation layers I are not drawn separated from one another.

In the representation of FIG. 1a, an uppermost layer of rewiring device 1a is an uppermost printed conductor level LB0, this structured uppermost printed conductor level LB0 being exposed.

Figure 1B:
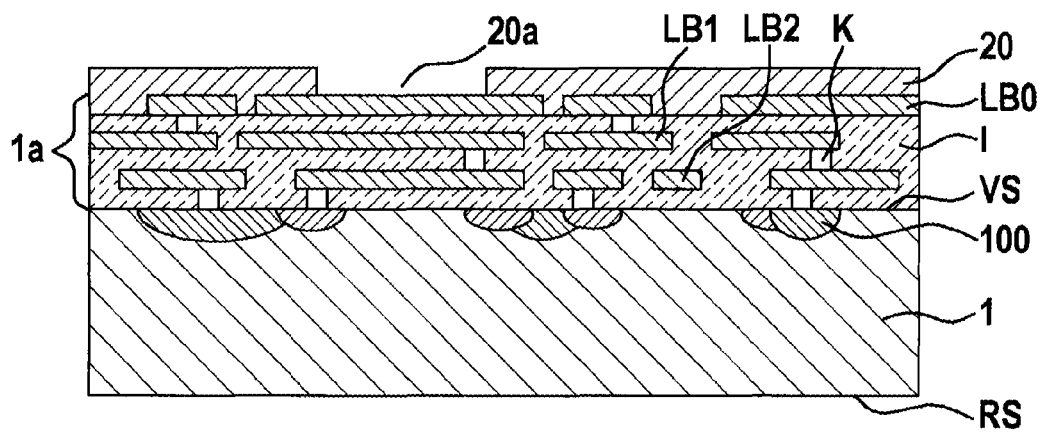

As illustrated in FIG. 1b, a resist mask 20 is applied to uppermost printed conductor level LB0 and structured in such a way that it has an opening 20a in an area where the getter layer is to be provided later. It is not necessary for the edges of resist mask 20 on opening 20a to have negative resist sidewalls, as is required, for example, in the classic lift-off process, where a relatively expensive negative resist is used. For that reason, a substantially more cost-effective positive resist may be used in this specific embodiment.

Figure 1C:
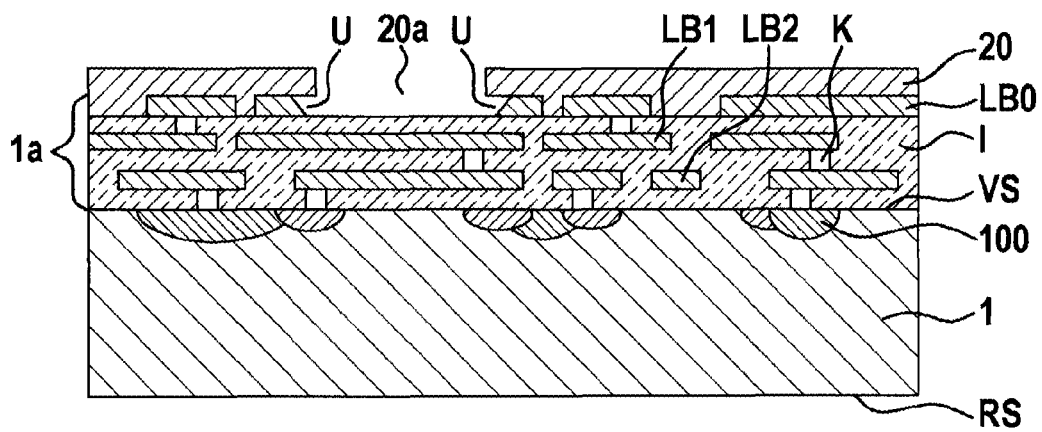

In an isotropic etching layer which is illustrated in FIG. 1c, uppermost printed conductor level LB0 is removed in certain areas in the area of opening 20a, undercuts U of uppermost printed conductor level LB0 occurring, on which the etch front lies under resist mask 20. Preferably, a wet chemical method is used for the isotropic etching step.

Although only uppermost printed conductor level LB0 is etched in certain areas in the present specific embodiment, of course, multiple levels of rewiring device 1 a may also be removed in the isotropic etching step, it possibly being necessary to alternate the etching chemical as a function of whether a printed conductor level or an insulation level I is etched. It is advantageous if an aluminum layer, which is readily isotropically etchable, is used as uppermost printed conductor level LB0.

Figure 1D:
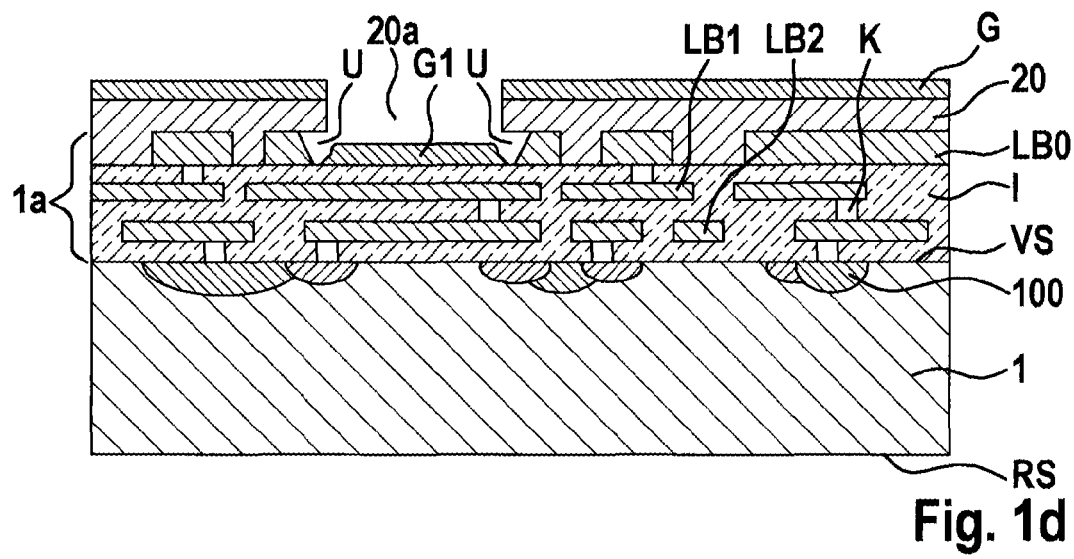

With further reference to FIG. 1d, getter layer G is applied. Preferably this getter layer G is deposited using an anisotropic coating method, for example, by sputtering or vapor deposition.

When getter layer G is applied, a sunken area G1 of getter layer G forms in the area of opening 20a, which, however, leaves undercut areas U of resist mask 20 open for the most part due to the anisotropy of the coating method.

Figure 1E:
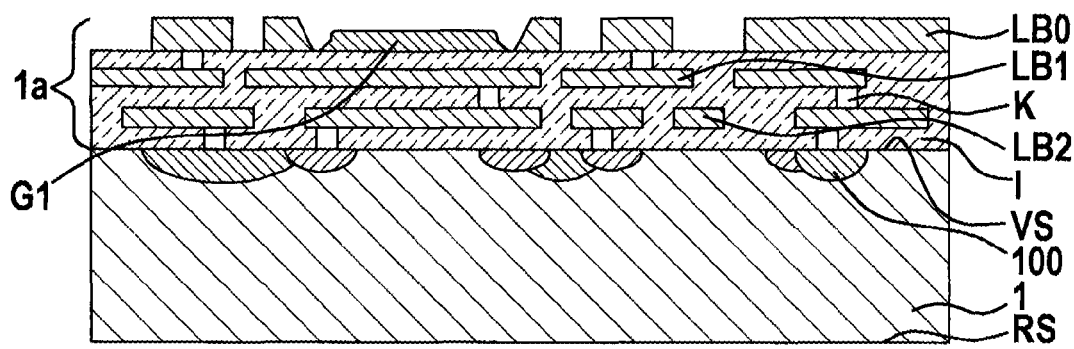

In a following process step, which is illustrated in FIG. 1e), resist mask 20 including getter layer G situated on it is removed in a lift-off method. Preferably, a water spray step or a bombardment with $CO_2$ is used for this lift-off process step.

As a result, only getter layer area G1, which did not lie on resist mask 20, remains on uppermost insulation layer I of rewiring device 1a, framed at a distance by areas of uppermost printed conductor level LB0.

Figure 1F:
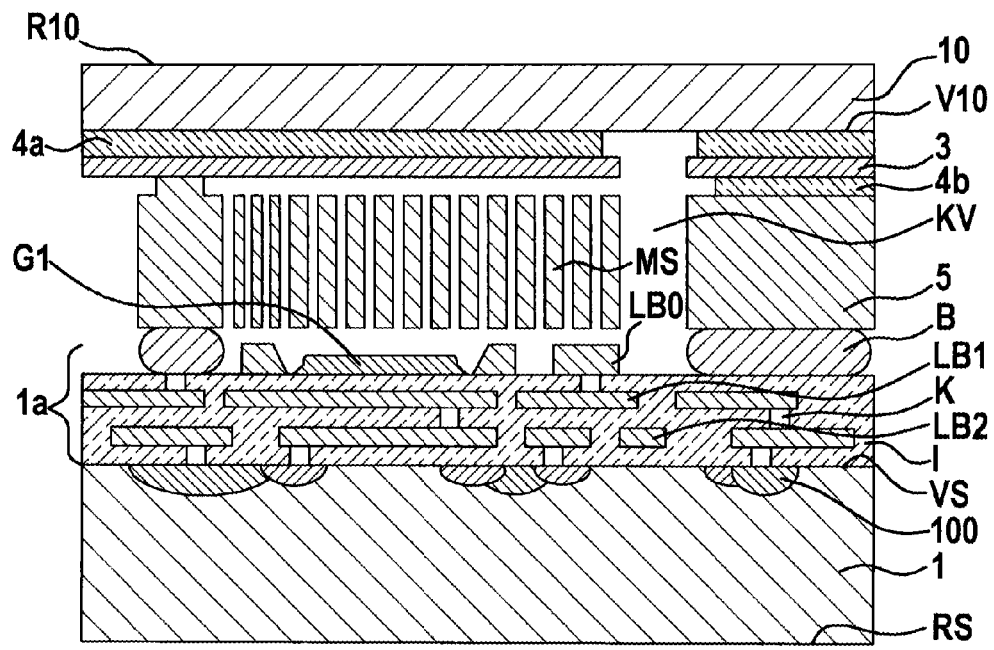

In a concluding process step, which is shown in FIG. 1f), an MEMS system is bonded to rewiring device 1a with the aid of a bond connection B.

The MEMS system includes an MEMS wafer 10 having a front side V10 and a rear side R10. On front side V10 of MEMS wafer 10 is situated a first insulation layer 4a, on which a printed conductor layer 3 is provided. A second insulation layer 4*b* is situated in areas on printed conductor layer 3, layers 4*a*, 4*b* being, for example, oxide layers.

A micromechanical functional layer 5 including a rotation rate sensor device MS is provided across printed conductor level 3 and second insulation layer 4*b*. Rotation rate sensor device MS is situated above remaining getter layer area G1 in a closed cavern KV.

During bonding with the aid of bond connection B in cavern KV, a high pressure is enclosed. Subsequently, getter layer G1 is activated via a temperature step. The getter pumps (getters) the volume of cavern KV of rotation rate sensor device MS to a low pressure. In order to enclose a defined pressure in it, a mixed gas including an inert gas and a gas which is readily gettered, for example, N2, is used. N2 is gettered and a non-gettering inert gas of the mixed gas, for example, Ne or Ar, then defines the internal pressure in cavern K of rotation rate sensor device MS.

Figure 2:
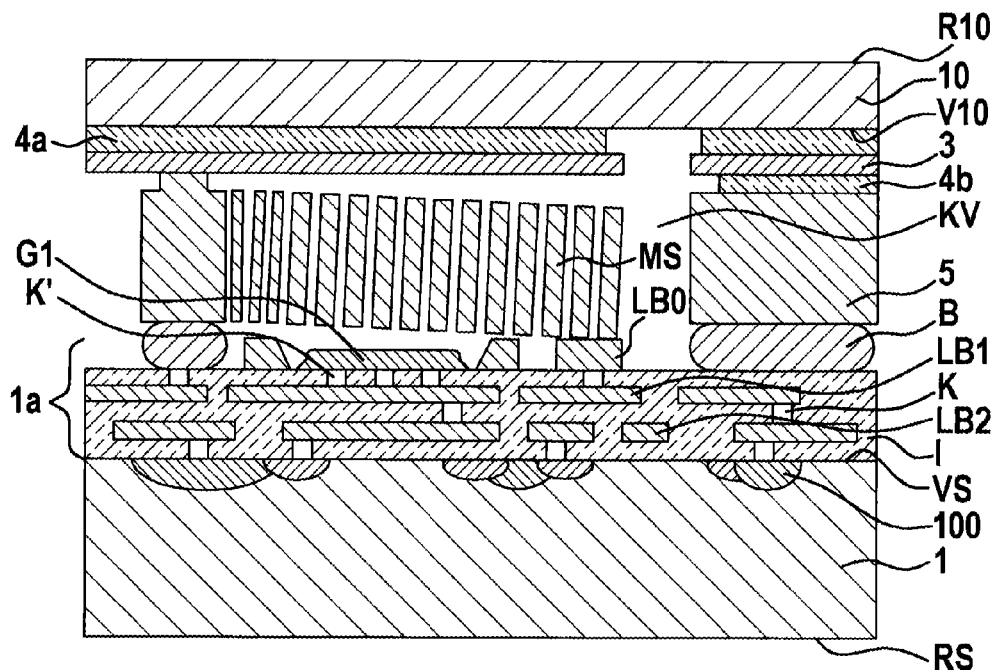
FIG. 2 shows a schematic cross-sectional view for elucidating a micromechanical sensor device and a corresponding manufacturing method according to a second specific embodiment of the present invention.

FIG. 2 is a schematic cross-sectional view for elucidating a micromechanical sensor device and a corresponding manufacturing method according to a second specific embodiment of the present invention.

In the second specific embodiment, getter layer area G1 is electrically connected to a CMOS circuit 100 via vias K', K' and printed conductor levels LB1, LB2. Getter layer area G1 may additionally be used as an electrode for driving or for sensing movable micromechanical rotation rate sensor device MS. Alternatively, getter layer area G1 may only be set to a defined potential, in order not to have a negative influence on the movement of the structures of micromechanical rotation rate sensor device MS or additional sensor devices in cavern KV, which are not shown.

As is apparent in FIG. 2, getter layer area G1 is selected to be thinner than uppermost printed conductor level LB0, as a result of which uppermost printed conductor level LB0 is used as a stop for rotation rate sensor device MS, which prevents it from coming into contact with getter layer area G1 and being adhesively bonded to it.

FIGS. 3*a* through f are schematic cross-sectional views for elucidating a micromechanical sensor device and a corresponding manufacturing method according to a third specific embodiment of the present invention.

Figure 3A:
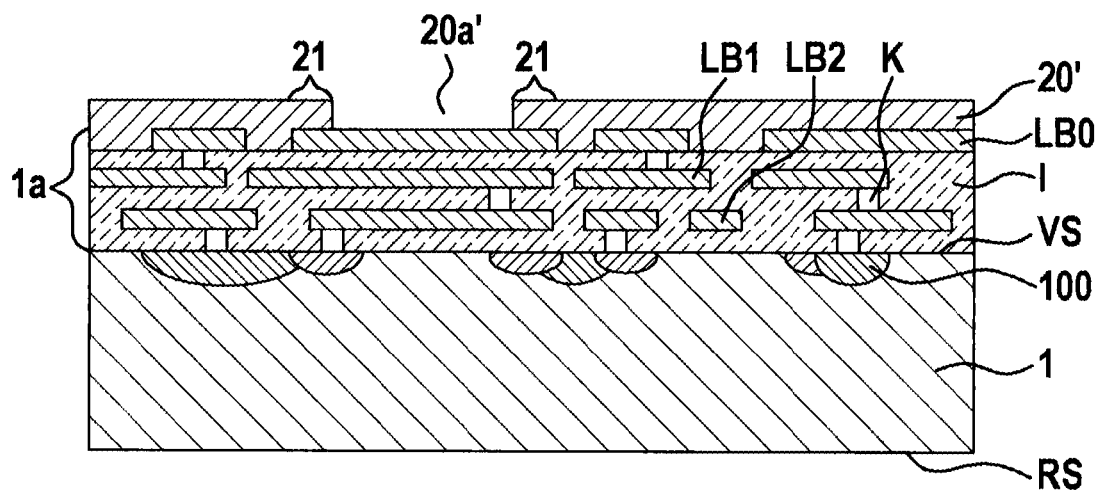
FIGS. 3a through f show schematic cross-sectional views for elucidating a micromechanical sensor device and a corresponding manufacturing method according to a third specific embodiment of the present invention.
Figure 3B:
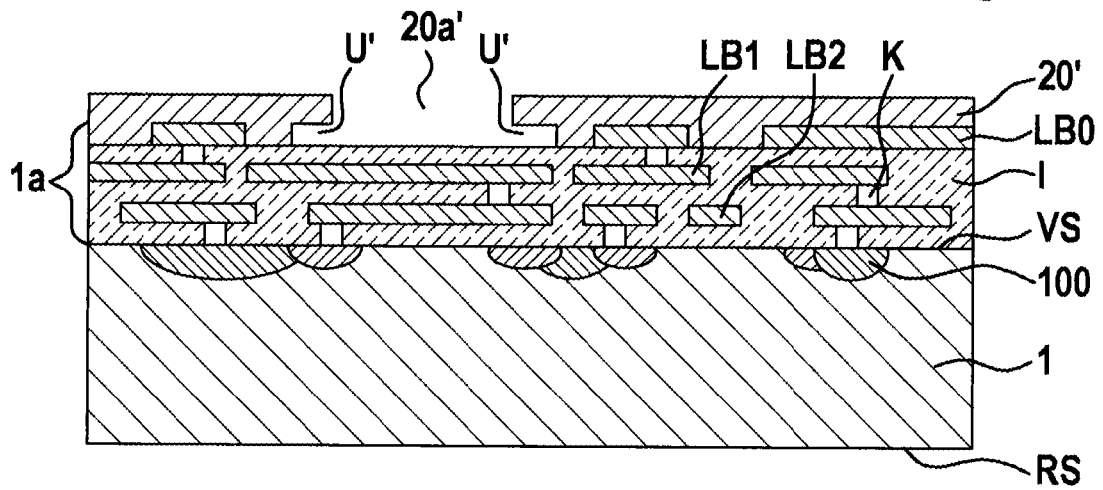

In the third specific embodiment, resist mask layer 20' projects beyond the area to be etched of uppermost printed conductor level LB0 only in a small area 21, as shown in FIGS. 3*a*), b). This makes it possible for the metal of uppermost printed conductor level LB0 to be completely removed under area 21 in the etching step under opening 20*a*', in order to form a large undercut U'.

Figure 3C:
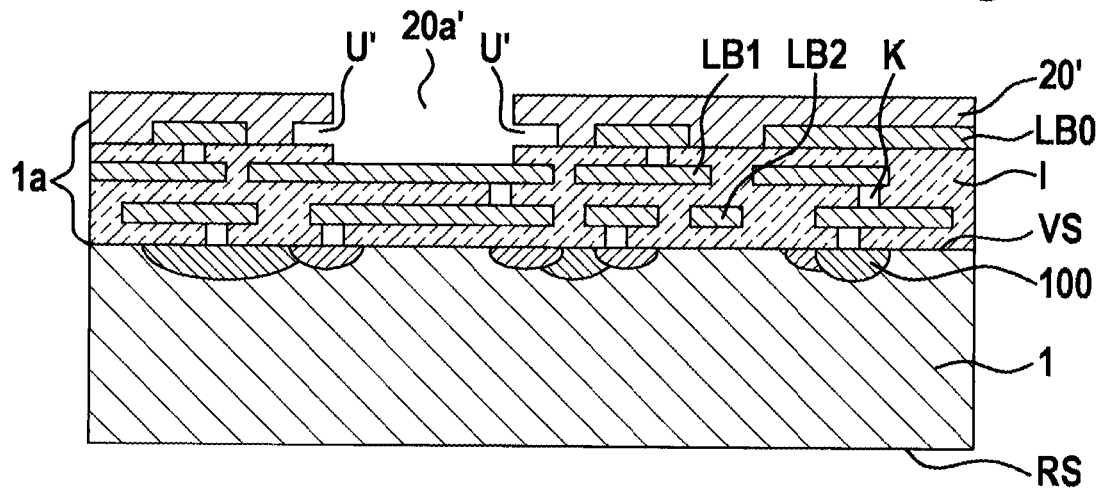
Figure 3D:
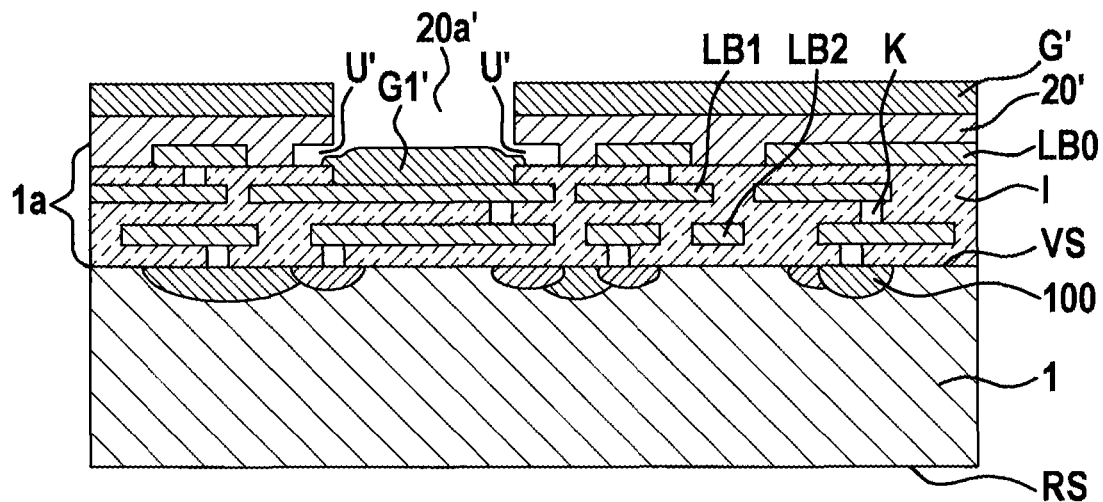

With further reference to FIG. 3*c*), uppermost insulation layer I is also removed in the isotropic etching process, in order to expose second uppermost printed conductor level LB1.

As already described above, the anisotropic coating method ensues for applying getter layer G', which forms sunken getter layer area G1' in the area of opening 20*a*'.

Figure 3E:
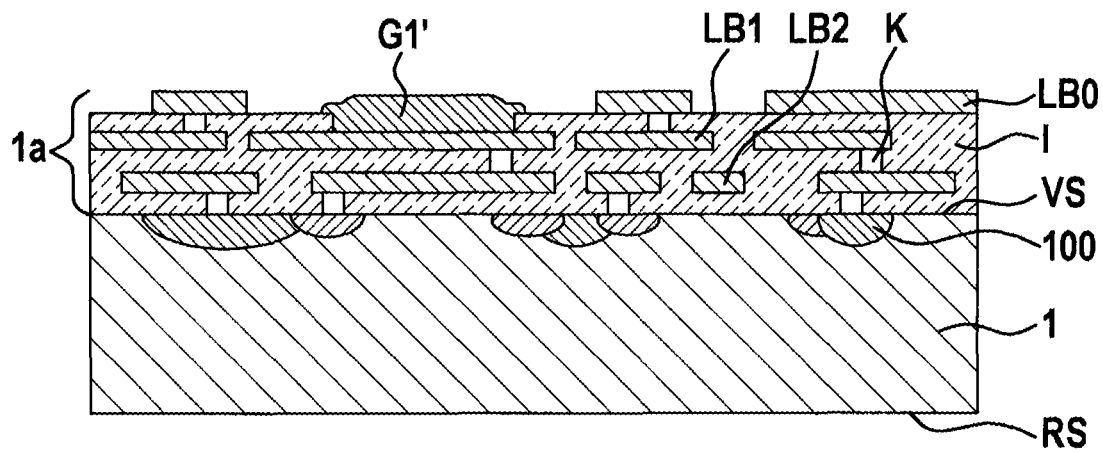

With further reference to FIG. 3*e*, the lift-off method step is carried out for removing getter layer G' situated on resist mask 20', getter layer area G1' remaining on second uppermost printed conductor level LB1.

Figure 3F:
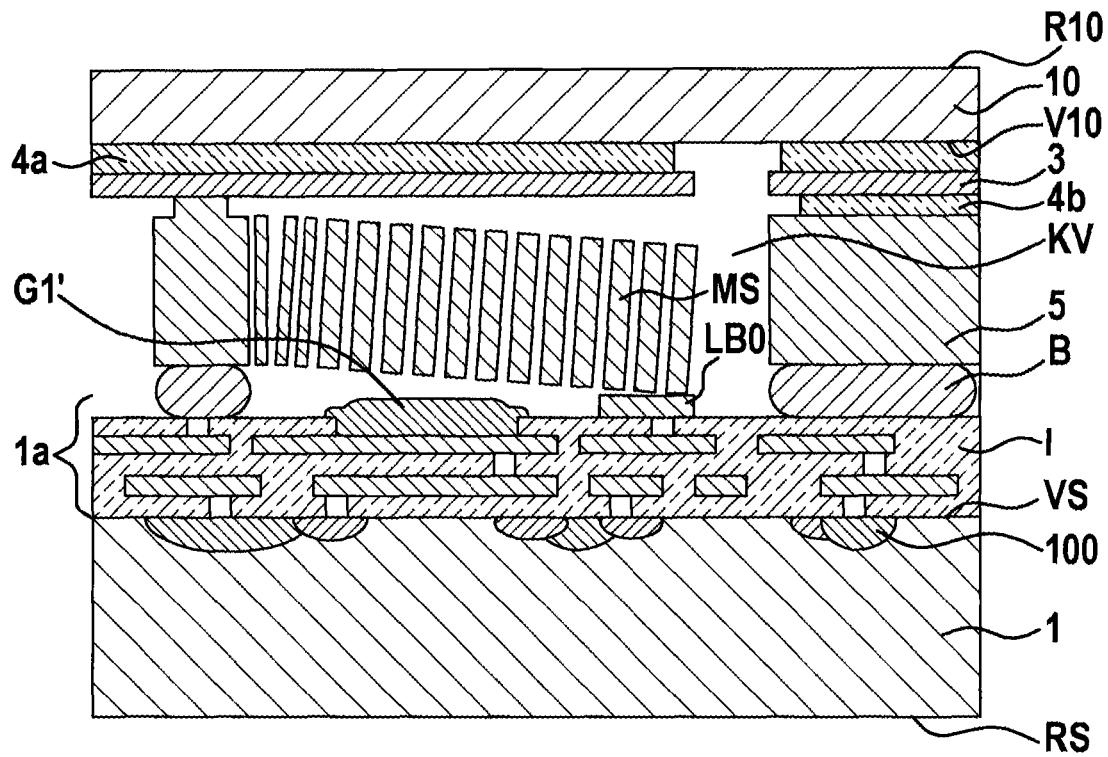

Also in the diagram according to FIG. 3*f*), uppermost printed conductor level LB0 is used as a stop for micromechanical rotation rate sensor device MS, so that an adhesive bond to getter layer area G1' is prevented here as well.

Otherwise, the third specific embodiment is identical to the first and second specific embodiments and may also be combined with them. In particular, getter layer area G1' is also connected to a CMOS circuit 100.

Although the present invention has been described with reference to preferred exemplary embodiments, it is not limited thereto. In particular, the above-named named materials and topologies are only exemplary and not limited to the explained examples.

Figure 4:
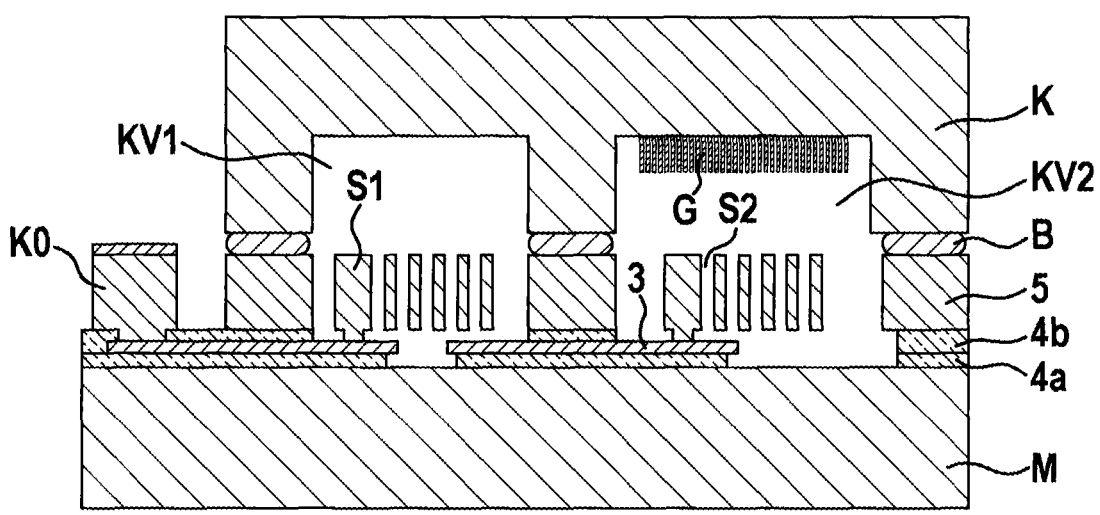
FIG. 4 shows a schematic cross-sectional view for elucidating an exemplary micromechanical sensor device and a corresponding manufacturing method for illustrating the problems underlying the present invention.

Although in the case of the above-described specific embodiments, only a micromechanical sensor device in the form of a rotation rate sensor device is provided in the cavern, of course, multiple different micromechanical pressure sensor devices may be provided in various caverns separate from one another, as was indicated, for example, with respect to FIG. 4 for the exemplary sensor device.

Although in the case of the above-described specific embodiments, the bond connection is placed on the uppermost insulation layer, it is also possible for the uppermost printed conductor level to be used as a bonding material for electrically connecting the MEMS system and the CMOS system and for the mechanical connection, in particular the hermetic sealing. For example, an AlGe compound is particularly favorable and robust, the bond connection being produced from Ge and the uppermost printed conductor level being produced from Al.

What is claimed is:

1. A micromechanical sensor device, comprising:
   a CMOS wafer having a front side and a rear side;
   a rewiring device formed on the front side of the CMOS wafer and including a plurality of stacked printed conductor levels and insulation layers;
   an MEMS wafer having a front side and a rear side;
   a micromechanical sensor device formed across the front side of the MEMS wafer in a layer that is different than of the MEMS wafer;
   a bond connection between the MEMS wafer and the CMOS wafer;
   a cavern between the MEMS wafer and the CMOS wafer, in which the sensor device is hermetically enclosed; and
   an exposed getter layer area applied to at least one of the plurality of stacked printed conductor levels and insulation layers;
   wherein the getter layer area has a front side that faces the MEMS wafer, an uppermost layer of the rewiring device has a front side that faces the MEMS wafer, such that a distance from the front side of the CMOS wafer to the front side of the uppermost layer of the rewiring device,
   wherein the sensor device is directly above the getter layer so that an axis that is perpendicular to the getter layer intersects the sensor device,
   wherein the getter layer is disposed in a recess formed in the rewiring device,
   wherein the sensor device flexes toward the getter layer and the rewiring device, and
   wherein the uppermost layer of the rewiring device serves as a stop that prevents the sensor device from contacting the getter layer.

2. The micromechanical sensor device as recited in claim 1, wherein:
   the uppermost layer of the rewiring device is an uppermost printed conductor level, and
   the getter layer area is embedded in the uppermost printed conductor level in such a way that the getter layer is applied to an insulation layer situated under the uppermost printed conductor level.

3. The micromechanical sensor device as recited in claim 1, wherein:
   the uppermost layer of the rewiring device is an uppermost printed conductor level, and
   the getter layer area is embedded in the uppermost printed conductor level and an insulation area situated under the uppermost printed conductor level in such a way that the getter layer area is applied to a second uppermost printed conductor level situated under the insulation layer.

4. The micromechanical sensor device as recited in claim 1, wherein the getter layer area is connected electrically to a CMOS circuit of the CMOS wafer via at least one via in the rewiring device.

* * * * *